US012426508B2

United States Patent
Ueda et al.

(10) Patent No.: US 12,426,508 B2
(45) Date of Patent: Sep. 23, 2025

(54) PIEZOELECTRIC COAXIAL SENSOR

(71) Applicant: Fujikura Ltd., Tokyo (JP)

(72) Inventors: Sho Ueda, Chiba (JP); Yuki Tanaka, Chiba (JP); Masayoshi Omura, Shizuoka (JP)

(73) Assignee: Fujikura Ltd., Tokyo (JP)

( * ) Notice: Subject to any disclaimer, the term of this patent is extended or adjusted under 35 U.S.C. 154(b) by 530 days.

(21) Appl. No.: 17/910,193

(22) PCT Filed: Mar. 3, 2021

(86) PCT No.: PCT/JP2021/008071
§ 371 (c)(1),
(2) Date: Feb. 16, 2023

(87) PCT Pub. No.: WO2021/182210
PCT Pub. Date: Sep. 16, 2021

(65) Prior Publication Data
US 2023/0189653 A1 Jun. 15, 2023

(30) Foreign Application Priority Data
Mar. 9, 2020 (JP) ................. 2020-039919

(51) Int. Cl.
*H10N 30/30* (2023.01)
*G01L 1/16* (2006.01)
*H10N 30/60* (2023.01)

(52) U.S. Cl.
CPC ............ *H10N 30/302* (2023.02); *G01L 1/16* (2013.01); *H10N 30/60* (2023.02)

(58) Field of Classification Search
CPC ......... H10N 30/302; H10N 30/60; G01L 1/16
See application file for complete search history.

(56) References Cited

U.S. PATENT DOCUMENTS

| | | | |
|---|---|---|---|
| 4,183,010 A | 1/1980 | Miller | |
| 4,695,988 A * | 9/1987 | Banno | G01V 1/208 310/800 |

(Continued)

FOREIGN PATENT DOCUMENTS

| | | |
|---|---|---|
| EP | 3 875 932 A1 | 9/2021 |
| GB | 2 203 587 A | 10/1988 |

(Continued)

OTHER PUBLICATIONS

International Search Report issued in corresponding International Application No. PCT/JP2021/008071 mailed May 18, 2021 (3 pages).

*Primary Examiner* — Octavia Hollington
(74) *Attorney, Agent, or Firm* — Osha Bergman Watanabe & Burton LLP

(57) ABSTRACT

A piezoelectric coaxial sensor includes: a center conductor including a conductive wire; a polymer piezoelectric layer covering an outer peripheral surface of the center conductor; a first outer conductor surrounding an outer peripheral surface of the polymer piezoelectric layer; a first jacket layer covering an outer peripheral surface of the first outer conductor; and a second outer conductor surrounding an outer peripheral surface of the first jacket layer. A voltage is generated between the center conductor and the first outer conductor based on induced charges generated in the polymer piezoelectric layer.

8 Claims, 6 Drawing Sheets

(56) References Cited

U.S. PATENT DOCUMENTS

| | | | | |
|---|---|---|---|---|
| 5,170,010 | A | * 12/1992 | Aldissi | H01B 11/1083 |
| | | | | 174/106 SC |
| 5,846,355 | A | * 12/1998 | Spencer | H01B 7/2825 |
| | | | | 427/119 |
| 6,137,058 | A | * 10/2000 | Moe | H01B 13/016 |
| | | | | 174/102 R |
| 6,271,621 | B1 | * 8/2001 | Ito | G01L 1/16 |
| | | | | 310/358 |
| 6,610,932 | B2 | * 8/2003 | Van Den Berg | H01B 13/30 |
| | | | | 174/36 |
| 11,925,121 | B2 | * 3/2024 | Ogasahara | H10N 30/60 |
| 12,114,575 | B2 | * 10/2024 | Oomura | G01L 1/16 |
| 2023/0131853 | A1 | * 4/2023 | Ueda | H10N 30/02 |
| | | | | 310/338 |

FOREIGN PATENT DOCUMENTS

| | | | | |
|---|---|---|---|---|
| JP | 2000111422 | A | * | 4/2000 |
| JP | 2004-119240 | A | | 4/2004 |
| JP | 2007-273478 | A | | 10/2007 |
| JP | 2009-37797 | A | | 2/2009 |
| JP | 2017-183570 | A | | 10/2017 |
| JP | 2018-182009 | A | | 11/2018 |
| JP | S610817 | B1 | | 11/2019 |

* cited by examiner

PIEZOELECTRIC COAXIAL SENSOR

TECHNICAL FIELD

The present invention relates to a piezoelectric coaxial sensor having excellent noise resistance characteristics as characteristics for suppressing external noise.

BACKGROUND

A piezoelectric coaxial sensor in which a piezoelectric element is arranged between a center conductor and an outer conductor of a coaxial cable is known. The piezoelectric coaxial sensor detects a force by detecting a voltage of the piezoelectric element generated when the force is applied from an outer peripheral surface of the sensor via the center conductor and the outer conductor. Using this property, deformation of an object to be measured on which the piezoelectric coaxial sensor is provided, a force applied to the object to be measured, vibration, and the like are detected. As the piezoelectric element of the piezoelectric coaxial sensor, a polymer piezoelectric body is generally used.

Patent Literature 1 below describes a piezoelectric coaxial cable which is the piezoelectric coaxial sensor. The piezoelectric coaxial cable includes a center conductor, a polymer piezoelectric layer covering an outer peripheral surface of the center conductor, an outer conductor surrounding an outer peripheral surface of the polymer piezoelectric layer, and a jacket layer covering an outer peripheral surface of the outer conductor.

[Patent Literature 1] JP 2017-183570 A

However, the piezoelectric coaxial sensor described in Patent Literature 1 is easily affected by an external electromagnetic field or the like, and a piezoelectric coaxial sensor having higher noise resistance characteristics is required.

SUMMARY

One or more embodiments of the present invention provide a piezoelectric coaxial sensor having excellent noise resistance characteristics.

A piezoelectric coaxial sensor of the present invention includes: a center conductor including a conductive wire; a polymer piezoelectric layer covering an outer peripheral surface of the center conductor; a first outer conductor surrounding an outer peripheral surface of the polymer piezoelectric layer; a first jacket layer covering an outer peripheral surface of the first outer conductor; and a second outer conductor surrounding an outer peripheral surface of the first jacket layer, in which a voltage is generated between the center conductor and the first outer conductor based on induced charges generated in the polymer piezoelectric layer.

According to the piezoelectric coaxial sensor, the second outer conductor acts as a shield layer, and it is possible to prevent an influence of an external electromagnetic field or the like from reaching the center conductor or the first outer conductor. Therefore, it is possible to prevent noise from being superimposed on the center conductor and the first outer conductor due to an external electromagnetic field or the like. Therefore, the piezoelectric coaxial sensor of the present invention can have excellent noise resistance characteristics.

The piezoelectric coaxial sensor may include a second jacket layer covering an outer peripheral surface of the second outer conductor.

The second jacket layer can insulate the outer peripheral surface of the second outer conductor acting as the shield layer from the outside. Therefore, it is possible to further prevent noise from overlapping the center conductor and the first outer conductor via the second outer conductor.

The first outer conductor may be formed by winding a plurality of conductive wires so as to surround the outer peripheral surface of the polymer piezoelectric layer, and a first metal foil layer that is wound between the metal coated film and the first outer conductor so as to surround the outer peripheral surface of the polymer piezoelectric layer and is in contact with the polymer piezoelectric layer and the first outer conductor may be further provided.

In this case, even when the conductive wire constituting the first outer conductor is biased, since the first metal foil layer is in contact with the polymer piezoelectric layer, it is possible to suppress the bias of the electrical resistance in the circumferential direction.

Alternatively, the first outer conductor may be formed by winding a plurality of conductive wires so as to surround the outer peripheral surface of the polymer piezoelectric layer, and a first metal foil layer wound so as to surround the outer peripheral surface of the first outer conductor may be further provided.

With this configuration, when the first outer conductor and the first metal foil layer are in contact with each other, a combined resistance of an electrical resistance of the first outer conductor and an electrical resistance of the first metal foil layer is lower than the electrical resistance of the first outer conductor alone, and thus, performance of the piezoelectric coaxial sensor can be improved. In this case, even when the conductive wire constituting the first outer conductor is biased, deviation of an electric flow in the circumferential direction can be suppressed by the first metal foil layer, and the performance can be stabilized. In addition, even when the conductive wire constituting the first outer conductor has a bias gap, the conductive wire is covered with the first metal foil layer over the entire circumference, and thus, it is possible to prevent noise due to an external electromagnetic wave or the like from being superimposed.

In this case, the first metal foil layer may be in contact with the first outer conductor.

Since the first metal foil layer is in contact with the first outer conductor, even when the conductive wire constituting the first outer conductor is biased, the first outer conductor and the first metal foil layer can suppress the bias of the electrical resistance in the circumferential direction.

Alternatively, the first outer conductor may be formed by winding a plurality of conductive wires so as to surround the outer peripheral surface of the polymer piezoelectric layer, and a first metal coated film which is wound so as to surround the outer peripheral surface of the first outer conductor and in which a metal film on at least one surface of a tape-shaped film made of resin may be further provided.

In this case, when the metal film is in contact with the first outer conductor, the combined resistance of the electrical resistance of the first outer conductor and the electrical resistance of the metal film of the first metal coated film is lower than the electrical resistance of the first outer conductor alone, and thus, the performance of the piezoelectric coaxial sensor can be improved. In this case, even when the conductive wire constituting the first outer conductor is biased, the bias of the electric flow in the circumferential direction can be suppressed by the metal film of the first metal coated film, and the performance can be stabilized. In addition, even when the conductive wire constituting the first outer conductor has uneven fine gaps, it is possible to prevent noise due to an external electromagnetic wave or the like from being superimposed by being covered with the metal film over the entire circumference.

In addition, when the first metal coated film is wound on the first outer conductor in a state in which the first metal film side faces the first outer conductor side and the film side faces the first jacket layer side, an insulator covering the first outer conductor and the metal film becomes a double layer of the film of the first metal coated film and the first jacket layer, and thus, an insulation capacitance between the first outer conductor and the second outer conductor can be reduced. Therefore, it is advantageous in terms of transmission of a measurement signal in the piezoelectric coaxial sensor, and in particular, improvement of transmission characteristics on a high-frequency side can be expected.

In this case, the metal film provided on one surface of the film of the first metal coated film may be in contact with the first outer conductor.

Since the metal film of the first metal coated film is in contact with the first outer conductor, even when the conductive wire constituting the first outer conductor 13 is biased, the first outer conductor and the metal film can suppress the bias of the electrical resistance in the circumferential direction.

In this case, the metal film of the first metal coated film may be a single-layer metal film.

In this case, as compared with the case where the metal film is a multilayer metal film, a film thickness of the first metal coated film can be reduced, and an outer diameter of the piezoelectric coaxial sensor can be reduced. Furthermore, as compared with a case where the metal film has multiple layers, the piezoelectric coaxial sensor can be reduced in weight and be easily flexible, and can be made small and lightweight. The piezoelectric coaxial sensor can suppress inhibition of vibration of a vibrator because of its light weight, and can measure the vibration more accurately. In addition, since the piezoelectric coaxial sensor is flexible, a shape of a measurement object to be attached can be diversified, and high-performance measurement according to the movement of the measurement object can be expected.

Alternatively, in this case, the metal film of the first metal coated film may be a multilayer metal film.

In this case, as compared with the case where the metal film is a single layer, adjustment of electric resistance and adjustment of adhesion between the metal film and the film can be facilitated. In addition, even in a case where a metal whose surface is easily rusted, such as copper, is used as a part of the metal layer, it is possible to protect the surface by using a metal which is not easily rusted for the metal layer exposed on the surface.

In addition, even when there is a defect such as formation of a pinhole in a part of the metal film or a thickness of a part of the metal film being thinner than a design value, the defect can be removed by another metal film, variation in film resistance in the circumferential direction can be suppressed, and deterioration in performance of the piezoelectric coaxial sensor due to the defect can be suppressed.

The second outer conductor may be formed by winding a plurality of conductive wires so as to surround the outer peripheral surface of the first jacket layer, and a second metal foil layer wound inside or outside the second outer conductor so as to surround the outer peripheral surface of the first jacket layer may be further provided.

In this case, even when the conductive wire constituting the second outer conductor is biased, the second metal foil layer can suppress an electromagnetic wave or the like that tries to pass between the second outer conductors. Therefore, noise can be further reduced.

In this case, the second metal foil layer may be in contact with the second outer conductor.

When the second metal foil layer is in contact with the second outer conductor, the second outer conductor and the second metal foil layer can be shielded by connecting one of the second metal foil layer and the second outer conductor to the ground without individually connecting the second metal foil layer and the second outer conductor to the ground.

Alternatively, the second outer conductor may be formed by winding a plurality of conductive wires so as to surround the outer peripheral surface of the first jacket layer, and a second metal coated film which is wound inside or outside the second outer conductor so as to surround an outer peripheral surface of the first jacket layer and in which a metal film is provided on at least one surface of a tape-shaped film made of a resin may be further provided.

In this case, even when the conductive wire constituting the second outer conductor is biased, the metal film of the second metal coated film can suppress an electromagnetic wave or the like that tries to pass between the conductive wires of the second outer conductor. Therefore, noise can be further reduced.

In this case, the metal film provided on one surface of the film of the second metal coated film may be in contact with the second outer conductor.

When the metal film of the second metal coated film is in contact with the second outer conductor, the second outer conductor and the metal film can be shielded by connecting one of the metal film and the second outer conductor to the ground without individually connecting the metal film and the second outer conductor to the ground.

In this case, the metal film of the second metal coated film may be a single-layer metal film.

In this case, as compared with the case where the metal film is a multilayer metal film, the film thickness of the second metal coated film can be reduced, and the outer diameter of the piezoelectric coaxial sensor can be reduced. Furthermore, as compared with a case where the metal film has multiple layers, the piezoelectric coaxial sensor can be reduced in weight and be easily flexible, and can be made small and lightweight. The piezoelectric coaxial sensor can suppress inhibition of vibration of a vibrator because of its light weight, and can measure the vibration more accurately. In addition, since the piezoelectric coaxial sensor is flexible, the shape of the measurement object to be attached can be diversified, and high-performance measurement according to the movement of the measurement object can be expected.

Alternatively, the metal film of the second metal coated film may be a multilayer metal film.

In this case, as compared with the case where the metal film is a single layer, adjustment of electric resistance and adjustment of adhesion between the metal film and the film can be facilitated. In addition, even in a case where a metal whose surface is easily rusted, such as copper, is used as a part of the metal layer, it is possible to protect the surface by using a metal which is not easily rusted for the metal layer exposed on the surface.

In addition, even when there is a defect such as formation of a pinhole in a part of the metal film or a thickness of a part of the metal film being thinner than a design value, the defect can be removed by another metal film, variation in film resistance in the circumferential direction can be suppressed, and deterioration in performance of the piezoelectric coaxial sensor due to the defect can be suppressed.

As described above, according to the present invention, a piezoelectric coaxial sensor having excellent noise resistance characteristics is provided.

DETAILED DESCRIPTION

Hereinafter, modes for implementing a piezoelectric coaxial sensor according to the present invention will be illustrated together with the accompanying drawings. Embodiments exemplified below are intended to facilitate understanding of the present invention and are not intended to limit the present invention. The present invention can be modified and improved from the following embodiments without departing from the gist thereof. In addition, in the present specification, dimensions of each member may be exaggerated for easy understanding.

First Embodiments

Figure 1:
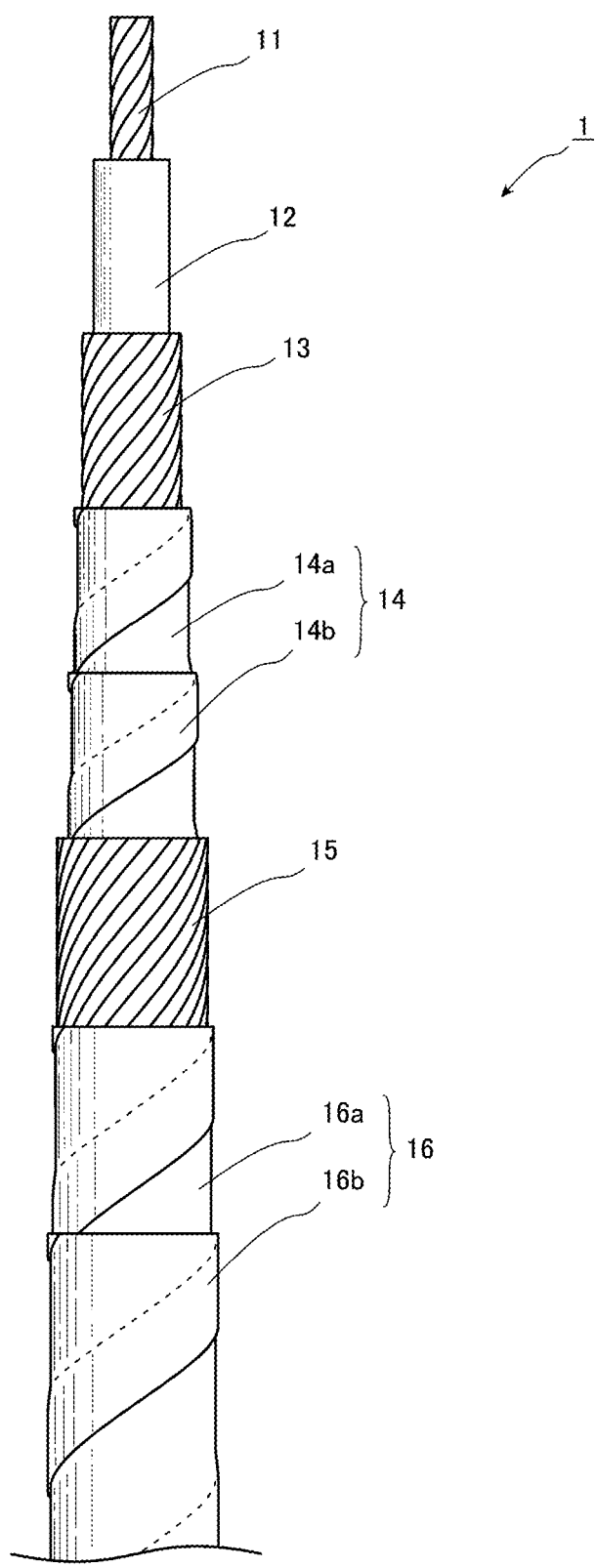
FIG. 1 is a view illustrating a piezoelectric coaxial sensor according to first embodiments of the present invention.

FIG. 1 is a view illustrating a piezoelectric coaxial sensor according to one or more embodiments. As illustrated in FIG. 1, a piezoelectric coaxial sensor 1 of one or more embodiments includes a center conductor 11, a polymer piezoelectric layer 12, a first outer conductor 13, a first jacket layer 14, a second outer conductor 15, and a second jacket layer 16.

The center conductor 11 is formed of stranded wires of a plurality of conductive wires. The conductive wire included in the center conductor 11 is made of a conductor, and is not particularly limited. Examples of such a conductor include a conductive wire made of copper, aluminum, a tin-plated soft copper alloy, or the like. Although FIG. 1 illustrates an example in which the center conductor 11 is formed of stranded wires of a plurality of conductive wires as described above, the center conductor 11 may be formed of a conductive single wire. In addition, the shape of the cross section of each conductive wire is not limited to a circular shape, and may be a rectangular shape. In addition, the center conductor 11 may be a stranded wire of a conductive wire and an insulating wire.

The polymer piezoelectric layer 12 is a layer covering the outer peripheral surface of the center conductor 11. In one or more embodiments, the polymer piezoelectric layer 12 is in contact with the outer peripheral surface of the center conductor 11. The polymer piezoelectric layer 12 is made of a polymer exhibiting piezoelectricity, and examples of such a polymer include polyvinylidene fluoride (PVDF), polylactic acid, and polyurea. The polymer piezoelectric layer 12 is formed to have a substantially circular outer shape in cross section by extrusion molding or the like. The polymer piezoelectric layer 12 may be formed by winding a tape-shaped film made of a polymer piezoelectric body around the center conductor 11. In this case, the film may be wound in a spiral winding or in a vertical winding.

The first outer conductor 13 is a conductor surrounding the outer peripheral surface of the polymer piezoelectric layer 12. In one or more embodiments, the first outer conductor 13 is in contact with the outer peripheral surface of the polymer piezoelectric layer 12. The first outer conductor 13 has a configuration in which a plurality of conductive wires are spirally wound in the same direction. Such a first outer conductor 13 is not particularly limited as long as it is made of a conductor, but is made of, for example, a conductor similar to the center conductor 11. Although FIG. 1 illustrates an example in which a plurality of conductive wires are spirally wound as the first outer conductor 13, the first outer conductor 13 may be a mesh wire in which a plurality of conductive wires are knitted.

As described above, the polymer piezoelectric layer 12 is in contact with the outer peripheral surface of the center conductor 11, and the first outer conductor 13 is in contact with the outer peripheral surface of the polymer piezoelectric layer 12. Therefore, when an external force applied to the piezoelectric coaxial sensor 1 is transmitted to the polymer piezoelectric layer 12 and induced charges are generated in the polymer piezoelectric layer 12, a voltage is generated between the center conductor 11 and the first outer conductor 13 based on the induced charges generated in the polymer piezoelectric layer 12. Therefore, by inducing and measuring the voltage between the center conductor 11 and the first outer conductor 13 to the outside of the piezoelectric coaxial sensor 1, it is possible to measure the force applied to the piezoelectric coaxial sensor 1.

Figure 2:
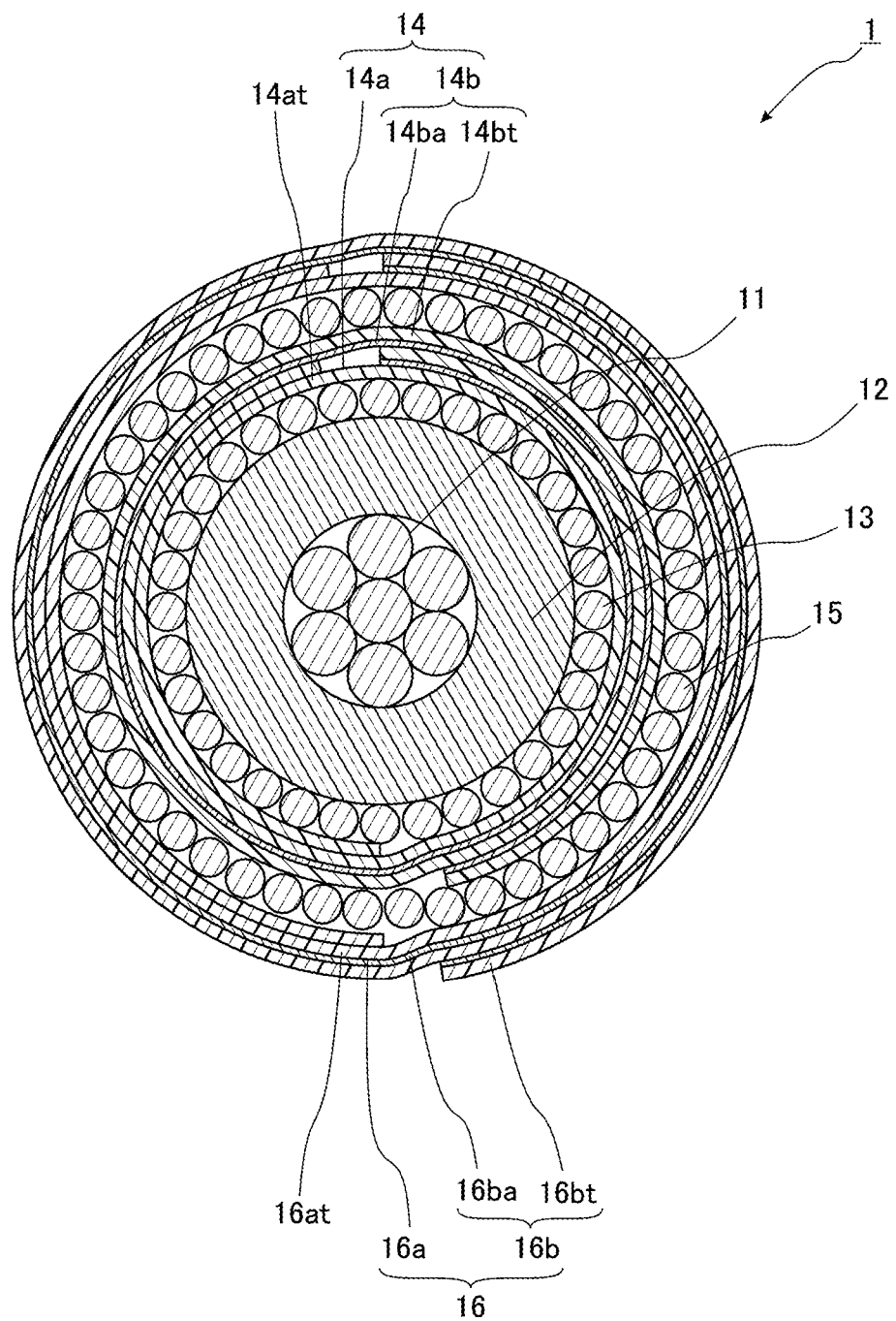
FIG. 2 is a view illustrating a structure in a cross section perpendicular to a longitudinal direction of the piezoelectric coaxial sensor in FIG. 1.

FIG. 2 is a view illustrating a structure in a cross section perpendicular to a longitudinal direction of the piezoelectric coaxial sensor 1 of FIG. 1. The first jacket layer 14 is a layer covering the outer peripheral surface of the first outer conductor 13. As illustrated in FIGS. 1 and 2, in one or more embodiments, the first jacket layer 14 includes an inner first jacket layer 14a and an outer first jacket layer 14b.

The inner first jacket layer 14a includes a tape-shaped film 14at made of resin, and the film 14at is spirally wound on the outer peripheral surface of the first outer conductor 13. No adhesive layer is provided on any surface of the film 14at, and the inner first jacket layer 14a is not adhered to the first outer conductor 13. The material of the film 14at is not particularly limited, and examples thereof include insulating resins such as polyethylene terephthalate, polyethylene naphthalate, polyimide, polyvinyl chloride, and polypropylene. Although the adhesive layer may be provided on one surface of the film 14at, the adhesive layer may not be provided on any surface of the film 14at as described above from the viewpoint that the inner first jacket layer 14a and the first outer conductor 13 can be easily peeled off when the first outer conductor 13 is led out.

As illustrated in FIG. 2, the outer first jacket layer 14b includes a tape-shaped film 14bt made of resin and an adhesive layer 14ba provided on one surface of the film 14bt. In the film 14bt, the adhesive layer 14ba faces the inner first jacket layer 14a side, and is spirally wound on the outer peripheral surface of the inner first jacket layer 14a. In the example of FIG. 1, the film 14bt of the outer first jacket layer 14b is wound in the same direction as that of the film 14at of the inner first jacket layer 14a, but the film 14bt of the outer first jacket layer 14b and the film 14at of the inner first jacket layer 14a may be wound in opposite directions. In addition, at least one of the film 14at and the film 14bt may be wound around a vertical winding. The material of the film 14bt is not particularly limited, and examples thereof include the same material as the film 14at. The adhesive used for the adhesive layer 14ba is not particularly limited, and examples thereof include an acrylic adhesive, a polyester-based adhesive, and a polyamide-based adhesive. The adhesive layer 14ba may not be provided, but the adhesive layer 14ba as described above may be provided from the viewpoint of suppressing unraveling of the film 14bt when the piezoelectric coaxial sensor 1 is repeatedly bent.

Note that one of the inner first jacket layer 14a and the outer first jacket layer 14b may be omitted, and the first jacket layer 14 may include the other of the inner first jacket layer 14a and the outer first jacket layer 14b. However, from the viewpoint of suppressing the unraveling of the first jacket layer 14 while allowing the first jacket layer 14 and the first outer conductor 13 to be easily peeled off, the first jacket layer 14 may include the non-adhesive inner first jacket layer 14a and the outer first jacket layer 14b having the adhesive layer 14ba as described above.

The second outer conductor 15 is a conductor surrounding the outer peripheral surface of the first jacket layer 14. The second outer conductor 15 has a configuration in which a plurality of conductive wires are spirally wound in the same direction. Such a second outer conductor 15 is not particularly limited as long as it is made of a conductor, but is made of, for example, the same conductor as the first outer conductor 13. Although FIG. 1 illustrates an example in which a plurality of conductive wires are spirally wound as the second outer conductor 15, the second outer conductor 15 may be a mesh wire in which a plurality of conductive wires are knitted.

The second jacket layer 16 is a layer covering the outer peripheral surface of the second outer conductor 15. In one or more embodiments, the second jacket layer 16 includes an inner second jacket layer 16a and an outer second jacket layer 16b.

The inner second jacket layer 16a includes a tape-shaped film 16at made of resin, and the film 16at is spirally wound on the outer peripheral surface of the second outer conductor 15. No adhesive layer is provided on any surface of the film 16at, and the inner second jacket layer 16a is not adhered to the second outer conductor 15. The material of the film 16at is not particularly limited, and examples thereof include the same material as that of the film 14at. Although the adhesive layer may be provided on one surface of the film 16at, the adhesive layer may not be provided on any surface of the film 16at as described above from the viewpoint that the inner second jacket layer 16a and the second outer conductor 15 can be easily peeled off when the second outer conductor 15 is led out.

As illustrated in FIG. 2, the outer second jacket layer 16b includes a tape-shaped film 16bt made of resin and an adhesive layer 16ba provided on one surface of the film 16bt. In the film 16bt, the adhesive layer 16ba faces the inner second jacket layer 16a side, and is spirally wound on the outer peripheral surface of the inner second jacket layer 16a. In the example of FIG. 1, the film 16bt of the outer second jacket layer 16b is wound in the same direction as that of the film 16at of the inner second jacket layer 16a, but the film 16bt of the outer second jacket layer 16b and the film 16at of the inner second jacket layer 16a may be wound in opposite directions. In addition, at least one of the film 16at and the film 16bt may be wound around a vertical winding. The material of the film 16bt is not particularly limited, and examples thereof include the same material as that of the film 16at. The adhesive used for the adhesive layer 16ba is not particularly limited, but examples thereof include the same adhesive as the adhesive used for the adhesive layer 14ba.

Note that the inner second jacket layer 16a may be omitted, and the second jacket layer 16 may include the outer second jacket layer 16b. However, from the viewpoint of suppressing the unraveling of the second jacket layer 16 while allowing the second jacket layer 16 and the second outer conductor 15 to be easily peeled off, the second jacket layer 16 may include the non-adhesive inner second jacket layer 16a and the outer second jacket layer 16b having the adhesive layer 16ba as described above.

As described above, the piezoelectric coaxial sensor 1 of one or more embodiments includes the center conductor 11 including the conductive wire, the polymer piezoelectric layer 12 covering the outer peripheral surface of the center conductor 11, the first outer conductor 13 surrounding the outer peripheral surface of the polymer piezoelectric layer 12, the first jacket layer 14 covering the outer peripheral surface of the first outer conductor 13, and the second outer conductor 15 surrounding the outer peripheral surface of the first jacket layer 14. In addition, a voltage is generated between the enter conductor 11 and the first outer conductor 13 based on induced charges generated in the polymer piezoelectric layer 12.

According to the piezoelectric coaxial sensor 1, the second outer conductor 15 acts as a shield layer, and it is possible to prevent an influence of an external electromagnetic field or the like from reaching the center conductor 11 or the first outer conductor 13. Therefore, it is possible to prevent noise from being superimposed on the center conductor 11 and the first outer conductor 13 due to an external electromagnetic field or the like. Therefore, the piezoelectric coaxial sensor 1 of one or more embodiments can have excellent noise resistance characteristics.

In addition, the piezoelectric coaxial sensor 1 of one or more embodiments includes the second jacket layer 16 covering the outer peripheral surface of the second outer conductor 15.

The second jacket layer 16 can insulate the outer peripheral surface of the second outer conductor 15 acting as a shield layer from the outside. Therefore, since the second outer conductor 15 can be reliably grounded, the second outer conductor 15 acts as a shield layer, and it is possible to further prevent noise from overlapping the center conductor 11 and the first outer conductor 13. Although the second jacket layer 16 is not an essential component, the piezoelectric coaxial sensor 1 may include the second jacket layer 16 from the viewpoint of further preventing noise from overlapping the center conductor 11 and the first outer conductor 13 as described above.

In one or more embodiments, the first outer conductor 13 and the second outer conductor 15 may be made of a metal foil, and the metal foil may be wound.

Second Embodiments

Next, second embodiments of the present invention will be described. Note that the same or equivalent components as those of the first embodiments are denoted by the same reference numerals, and redundant description will be omitted unless otherwise specified.

Figure 3:
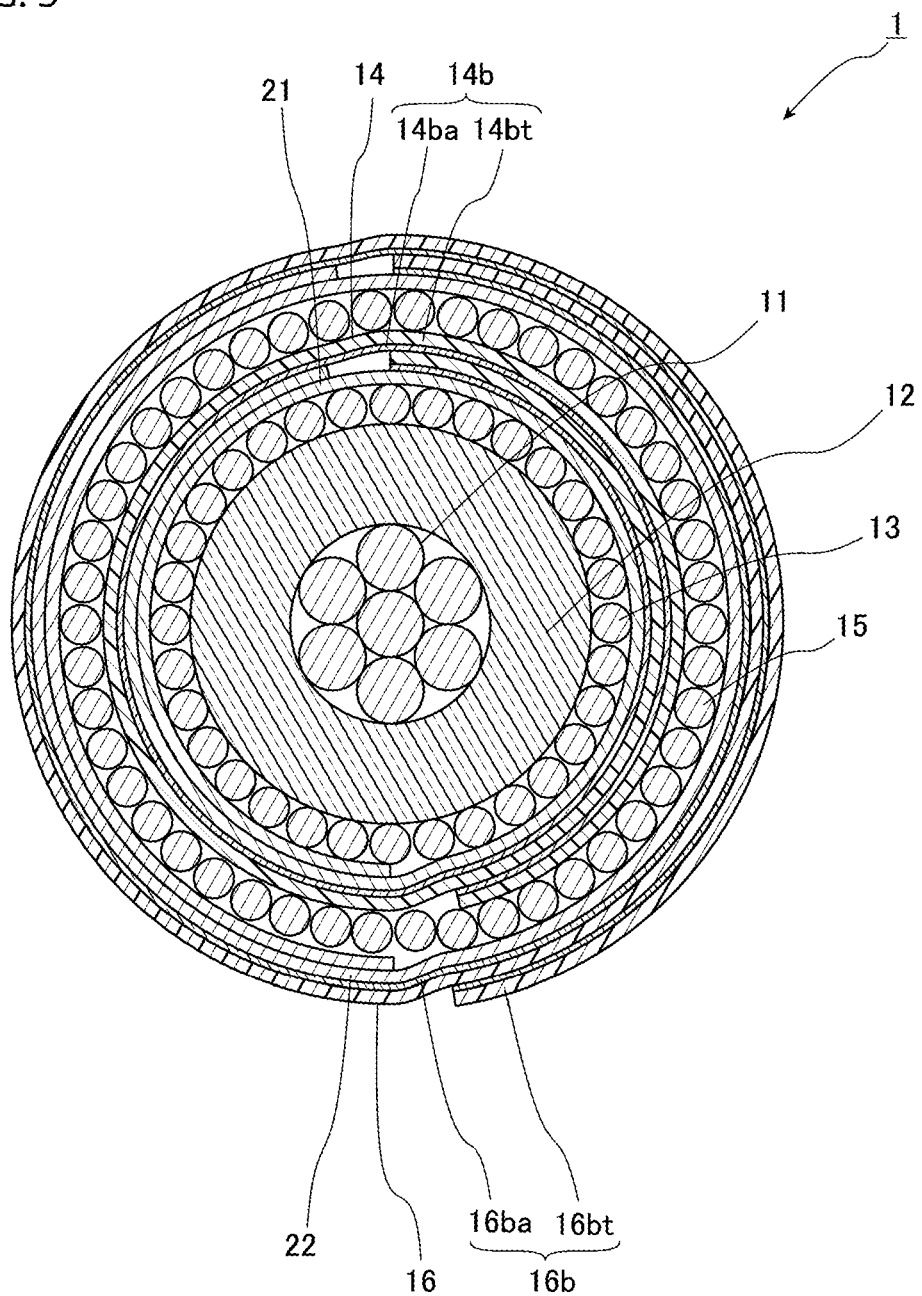
FIG. 3 is a view illustrating a piezoelectric coaxial sensor according to second embodiments of the present invention.

FIG. 3 is a view illustrating a piezoelectric coaxial sensor according to one or more embodiments. As illustrated in FIG. 3, a piezoelectric coaxial sensor 1 of one or more embodiments is different from the piezoelectric coaxial sensor 1 of the first embodiments in that a first metal foil layer 21 is provided instead of the inner first jacket layer 14a, and a second metal foil layer 22 is provided instead of the inner second jacket layer 16a.

The first metal foil layer 21 of one or more embodiments is in contact with the outer peripheral surface of the first outer conductor 13 and wound so as to surround the first outer conductor 13. Therefore, the first metal foil layer 21 is electrically connected to the first outer conductor 13. The metal constituting first metal foil layer 21 is not particularly limited as long as it is a metal, and examples thereof include copper and aluminum. The first metal foil layer 21 is not provided with an adhesive layer, and the first metal foil layer 21 is not adhered to the first outer conductor 13.

The second metal foil layer 22 of one or more embodiments is in contact with the outer peripheral surface of the second outer conductor 15 and wound so as to surround the second outer conductor 15. Therefore, the second metal foil layer 22 is electrically connected to second outer conductor 15. Examples of the metal constituting second metal foil layer 22 include the same metal as the metal constituting first metal foil layer 21. The second metal foil layer 22 is not provided with an adhesive layer, and the second metal foil layer 22 is not adhered to the second outer conductor 15.

As described above, in the piezoelectric coaxial sensor 1 of one or more embodiments, the first outer conductor 13 is formed by winding a plurality of conductive wires so as to surround the outer peripheral surface of the polymer piezoelectric layer 12, the piezoelectric coaxial sensor 1 includes the first metal foil layer 21 wound so as to surround the outer peripheral surface of the first outer conductor 13, and the first metal foil layer 21 is in contact with the first outer conductor 13. According to the piezoelectric coaxial sensor 1, even when the conductive wires constituting the first outer conductor 13 are biased, the first outer conductor 13 and the first metal foil layer 21 can suppress the bias of the electrical resistance in the circumferential direction.

Although not particularly illustrated, the first metal foil layer 21 may be provided between the polymer piezoelectric layer 12 and the first outer conductor 13. In this case, the first metal foil layer 21 is wound so as to surround the outer peripheral surface of the polymer piezoelectric layer 12, and is provided so as to be in contact with the polymer piezoelectric layer 12 and the first outer conductor 13. In this case, even when the conductive wire constituting the first outer conductor 13 is biased, since the first metal foil layer 21 is in contact with the polymer piezoelectric layer 12, it is possible to further suppress the bias of the electrical resistance in the circumferential direction.

Although not particularly illustrated, when the first metal foil layer 21 is wound so as to surround the outer peripheral surface of the first outer conductor 13, the first metal foil layer 21 may be separated from the first outer conductor 13 and not electrically connected to the first outer conductor 13. In this case, since the first metal foil layer 21 is connected to the ground, the first metal foil layer 21 can act as a shield, and the noise can be further suppressed as compared with the piezoelectric coaxial sensor 1 of the first embodiments.

In the piezoelectric coaxial sensor 1 of one or more embodiments, the second outer conductor 15 is formed by winding a plurality of conductive wires so as to surround the outer peripheral surface of the first jacket layer 14, the piezoelectric coaxial sensor 1 includes the second metal foil layer 22 wound outside the second outer conductor 15 so as to surround the outer peripheral surface of the first jacket layer 14, and the second metal foil layer 22 is in contact with the second outer conductor 15. With the configuration, even when the conductive wires constituting the second outer conductor 15 are biased, the second metal foil layer 22 can suppress an electromagnetic wave or the like that tries to pass between the conductive wires of the second outer conductor 15. Therefore, the noise can be further reduced as compared with the piezoelectric coaxial sensor 1 of the first embodiments. In addition, since the second metal foil layer 22 is in contact with the second outer conductor 15, even when the second metal foil layer 22 and the second outer conductor 15 are not individually connected to the ground, the second outer conductor 15 and the second metal foil layer 22 can be shielded by connecting one of the second outer conductor 15 and the second metal foil layer 22 to the ground.

Although not particularly illustrated, the second metal foil layer 22 may be provided inside the second outer conductor 15 and may be in contact with the second outer conductor 15. Even in this case, the second metal foil layer 22 can suppress the electromagnetic wave or the like that tries to pass between the conductive wires of the second outer conductor 15. Therefore, the noise can be further reduced as compared with the piezoelectric coaxial sensor 1 of the first embodiments. In addition, since the second metal foil layer 22 is in contact with the second outer conductor 15, even when the second metal foil layer 22 and the second outer conductor 15 are not individually connected to the ground, the second outer conductor 15 and the second metal foil layer 22 can be shielded by connecting one of the second outer conductor 15 and the second metal foil layer 22 to the ground.

Although not particularly illustrated, in either case where the second metal foil layer 22 is provided on the outer side or the inner side of the second outer conductor 15, the second metal foil layer 22 may be separated from the second outer conductor 15 and not electrically connected to the second outer conductor 15. In this case, by connecting the second metal foil layer 22 to the ground, the second metal foil layer can act as a shield, and the noise can be further suppressed as compared with the piezoelectric coaxial sensor 1 of the first embodiments.

Third Embodiments

Next, third embodiments of the present invention will be described. Note that the same or equivalent components as those of the first embodiments are denoted by the same reference numerals, and redundant description will be omitted unless otherwise specified.

Figure 4:
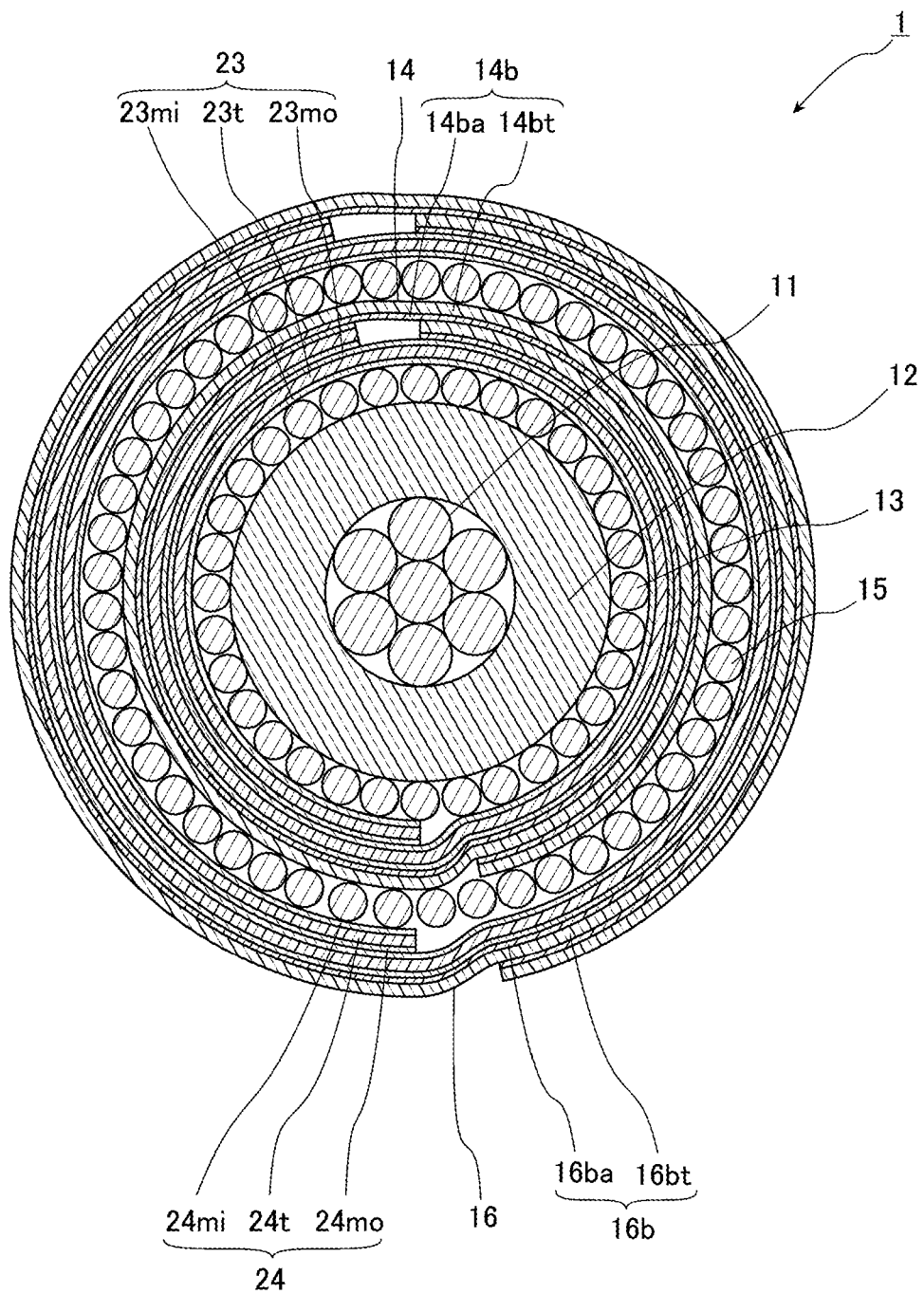
FIG. 4 is a view illustrating a piezoelectric coaxial sensor according to third embodiments of the present invention.

FIG. 4 is a view illustrating a piezoelectric coaxial sensor according to one or more embodiments. As illustrated in FIG. 4, a piezoelectric coaxial sensor 1 according to one or more embodiments is different from the piezoelectric coaxial sensor 1 according to the first embodiments in that a first metal coated film 23 is provided instead of the inner first jacket layer 14a, and a second metal coated film 24 is provided instead of the inner second jacket layer 16a.

In the first metal coated film 23, an inner first metal film 23mi is provided on one surface of a tape-shaped film 23t made of resin, and an outer first metal film 23mo is provided on the other surface. The film 23t has, for example, the same configuration as that of the film 14at of the inner first jacket layer 14a. In addition, the inner first metal film 23mi and the outer first metal film 23mo have the same configuration as each other, for example, and are single-layer films formed by stacking metals such as copper and aluminum by vapor deposition, sputtering, or the like.

In one or more embodiments, the first metal coated film 23 is wound so as to surround the outer peripheral surface of the first outer conductor 13, the inner first metal film 23$mi$ is in contact with the first outer conductor 13, and the outer first metal film 23$mo$ is not in contact with the first outer conductor 13. However, in one or more embodiments, the first metal coated film 23 is wound one or more turns in the circumferential direction, and there is a portion where the first metal coated film 23 is doubled. Therefore, in this region, the outer first metal film 23$mo$ is in contact with the inner first metal film 23$mi$. Therefore, the outer first metal film 23$mo$ is electrically connected to the first outer conductor 13 via the inner first metal film 23$mi$. The first metal coated film 23 is not provided with an adhesive layer, and the first metal coated film 23 is not adhered to the first outer conductor 13.

In the second metal coated film 24, an inner second metal film 24$mi$ is provided on one surface of a tape-shaped film 24$t$ made of resin, and an outer second metal film 24$mo$ is provided on the other surface. The film 24$t$ has, for example, the same configuration as that of the film 23$t$ of the first metal coated film 23. In addition, the inner second metal film 24$mi$ and the outer second metal film 24$mo$ have the same configuration as those of, for example, the inner first metal film 23$mi$ and the outer first metal film 23$mo$. The second metal coated film 24 is not provided with an adhesive layer, and the second metal coated film 24 is not adhered to the second outer conductor 15.

In one or more embodiments, the second metal coated film 24 is wound so as to surround the outer peripheral surface of the second outer conductor 15, the inner second metal film 24$mi$ is in contact with the second outer conductor 15, and the outer second metal film 24$mo$ is not in contact with the second outer conductor 15. However, in one or more embodiments, the second metal coated film 24 is wound one or more turns in the circumferential direction, and there is a portion where the second metal coated film 24 is doubled. Therefore, at this portion, the outer second metal film 24$mo$ is in contact with the inner second metal film 24$mi$. Therefore, the outer second metal film 24$mo$ is electrically connected to the second outer conductor 15 via the inner second metal film 24$mi$.

As described above, in the piezoelectric coaxial sensor 1 of one or more embodiments, the first outer conductor 13 is formed by winding a plurality of conductive wires so as to surround the outer peripheral surface of the polymer piezoelectric layer 12, the piezoelectric coaxial sensor 1 includes the first metal coated film 23 which is wound so as to surround the outer peripheral surface of the first outer conductor 13 and in which metal films are provided on both surfaces of the tape-shaped film 23$t$ made of resin, and the inner first metal film 23$mi$ provided on one surface of the film 23$t$ of the first metal coated film 23 is in contact with the first outer conductor 13. According to the piezoelectric coaxial sensor 1, even when the conductive wires constituting the first outer conductor 13 are biased, the first outer conductor 13 and the inner first metal film 23$mi$ can suppress the bias of the electrical resistance in the circumferential direction.

In one or more embodiments, the inner first metal film 23$mi$ and the outer first metal film 23$mo$ are in contact with each other. In such a configuration, since the combined resistance of the electric resistance of the inner first metal film 23$mi$ and the electric resistance of the outer first metal film 23$mo$ is lower than the resistance of the inner first metal film 23$mi$ alone, the electric resistance can be reduced as compared with the case where the inner first metal film 23$mi$ and the outer first metal film 23$mo$ are not in contact with each other, and the performance of the piezoelectric coaxial sensor 1 can be improved.

In addition, even when there is a problem such as a pinhole being formed in the inner first metal film 23$mi$ or the outer first metal film 2$mo$, or a problem that the film thickness of the inner first metal film 23$mi$ or the outer first metal film 23$mo$ is thinner than a design value, the one defective metal film faces the other metal film, and the one defective metal film and the other metal film overlap each other, so that the above problem can be covered, and variations in the resistance of the metal film in the circumferential direction can be suppressed. In addition, since the pinholes are covered with another metal film, it is possible to prevent noise due to an external electromagnetic wave or the like from being superimposed. In addition, it is possible to suppress the deviation of the electric flow in the circumferential direction. Therefore, improvement and stabilization of the performance of the piezoelectric coaxial sensor can be expected.

Although not particularly illustrated, the inner first metal film 23$mi$ may be separated from the first outer conductor 13 and not electrically connected to the first outer conductor 13. In this case, since the inner first metal film 23$mi$ and the outer first metal film 23$mo$ are connected to the ground, they can act as a shield, and the noise can be further suppressed as compared with the piezoelectric coaxial sensor 1 of the first embodiments.

Although not particularly illustrated, the inner first metal film 23$mi$ or the outer first metal film 23$mo$ may be omitted. In this case, even when the metal film is not in contact with the first outer conductor 13, the metal film can act as a shield by being connected to the ground, and noise can be further suppressed.

Further, in the piezoelectric coaxial sensor 1 of one or more embodiments, the second outer conductor 15 is formed by winding a plurality of conductive wires so as to surround the outer peripheral surface of the first jacket layer 14, the piezoelectric coaxial sensor 1 includes the second metal coated film 24 which is wound so as to surround the outer peripheral surface of the second outer conductor 15 and in which metal films are provided on both surfaces of the tape-shaped film 24$t$ made of resin, and the inner second metal film 24$mi$ provided on one surface of the film 24$t$ of the second metal coated film 24 is in contact with the second outer conductor 15. According to the piezoelectric coaxial sensor 1, even when the conductive wires constituting the second outer conductor 15 are biased, the inner second metal film 24$mi$ and the outer second metal film 24$mo$ of the second metal coated film can suppress an electromagnetic wave or the like that tries to pass between the conductive wires of the second outer conductor 15. Therefore, the noise can be further reduced as compared with the piezoelectric coaxial sensor 1 of the first embodiments. Further, since the inner second metal film 24$mi$ of the second metal coated film 24 is in contact with the second outer conductor, the inner second metal film 24$mi$ and the second outer conductor 15 can be shielded by connecting one of the inner second metal film 24$mi$ and the second outer conductor 15 to the ground without individually connecting the inner second metal film 24$mi$ and the second outer conductor 15 to the ground.

In one or more embodiments, the inner second metal film 24$mi$ and the outer second metal film 24$mo$ are in contact with each other. Therefore, one of the inner second metal film $24mi$ and the outer second metal film $24mo$ is connected to the ground, and thus, the inner second metal film $24mi$ and the outer second metal film $24mo$ can be shielded.

Although not particularly illustrated, the inner second metal film $24mi$ may be separated from the second outer conductor 15 and not electrically connected to the second outer conductor 15. In this case, since the inner second metal film $24mi$ and the outer second metal film $24mo$ are connected to the ground, the inner second metal film $24mi$ and the outer second metal film $24mo$ can act as shields, and noise can be further suppressed as compared with the piezoelectric coaxial sensor 1 of the first embodiments.

Although not particularly illustrated, the inner second metal film $24mi$ or the outer second metal film $24mo$ may be omitted. In this case, even when the metal film is not in contact with the second outer conductor 15, the metal film can act as a shield by being connected to the ground, and noise can be suppressed.

Although not particularly illustrated, the second metal coated film 24 may be provided inside the second outer conductor 15, and the second outer conductor 15 and the outer second metal film $24mo$ may be in contact with each other. Even in this case, the inner second metal film $24mi$ and the outer second metal film $24mo$ of the second metal coated film can suppress an electromagnetic wave or the like that tries to pass between the conductive wires of the second outer conductor 15. Therefore, the noise can be further reduced as compared with the piezoelectric coaxial sensor 1 of the first embodiments. Further, since the outer second metal film $24mo$ of the second metal coated film 24 is in contact with the second outer conductor, even when the outer second metal film $24mo$ and the second outer conductor 15 are not individually connected to the ground, the second outer conductor 15 and the outer second metal film $24mo$ can be shielded by connecting one of the second outer conductor 15 and the outer second metal film $24mo$ to the ground.

Although not particularly illustrated, even when the second metal coated film 24 is provided inside the second outer conductor 15, the outer second metal film $24mo$ of the second metal coated film 24 may be separated from the second outer conductor 15 and not electrically connected to the second outer conductor 15. In this case, since the outer second metal film $24mo$ and the inner second metal film $24mi$ are connected to the ground, the outer second metal film $24mo$ and the inner second metal film $24mi$ can act as shields, and noise can be further suppressed as compared with the piezoelectric coaxial sensor 1 of the first embodiments. When the second metal coated film 24 is provided inside the second outer conductor 15, the outer second metal film $24mo$ may be omitted. In this case, although the inner second metal film $24mi$ is not in contact with the second outer conductor 15, the inner second metal film $24mi$ can act as a shield by being connected to the ground, and noise can be suppressed.

Figure 5:
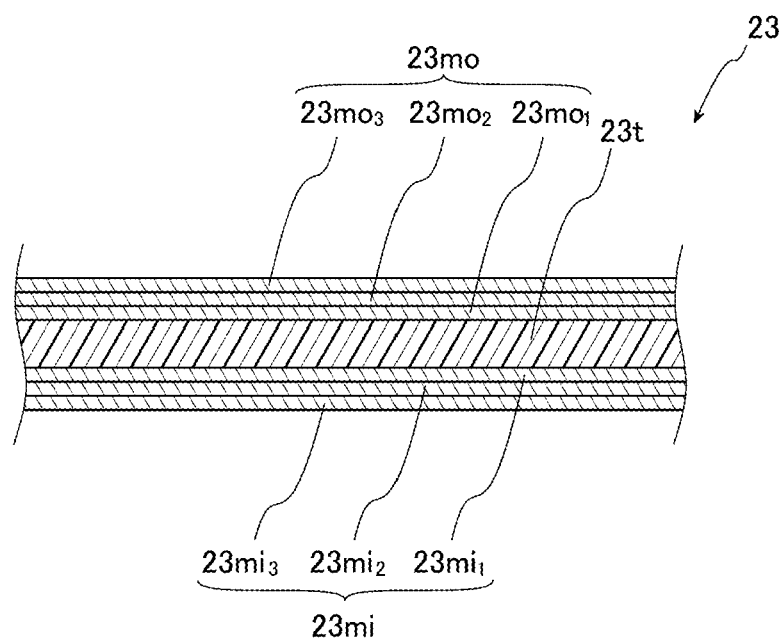
FIG. 5 is a view illustrating a modification of the first metal coated film in the third embodiments.

In the first metal coated film 23 of one or more embodiments, the configuration in which the single-layer inner first metal film $23mi$ and the single-layer outer first metal film $23mo$ are provided on both surfaces of the film $23t$ has been exemplified. However, the inner first metal film $23mi$ and the outer first metal film $23mo$ may be multilayer metal films. FIG. 5 is a view illustrating such a modification. In the example of FIG. 5, the inner first metal film $23mi$ includes three metal layers $23mi_1$ to $23mi_3$, and the outer first metal film $23mo$ includes three metal layers $23mo_1$ to $23mo_3$. As described above, since the inner first metal film $23mi$ and the outer first metal film $23mo$ are made of a multilayer metal film, electric resistance can be reduced as compared with a case where each of the inner first metal film $23mi$ and the outer first metal film $23mo$ is made of a single-layer metal film. Therefore, the performance of the piezoelectric coaxial sensor 1 can be improved.

In addition, even when there is a defect such as a pinhole being formed in some metal layers of the metal layers $23mi_1$ to $23mi_3$ of the inner first metal film $23mi$ or some metal layers of the metal layers $23mo_1$ to $23mo_3$ of the outer first metal film $23mo$, or thicknesses of some metal layers being thinner than a design value, the defect can be removed by another metal layer, and variation in film resistance in the circumferential direction can be suppressed. Therefore, it is possible to suppress a decrease in performance of the piezoelectric coaxial sensor 1 due to a defect. In addition, since the pinholes are covered with another metal layer, it is possible to prevent noise due to an external electromagnetic wave or the like from being superimposed.

In addition, as compared with the case where the inner first metal film $23mi$ and the outer first metal film $23mo$ are single layers, adjustment of electric resistance and adjustment of adhesion between these metal films and the film can be facilitated. For example, when it is difficult to directly form a metal layer of copper on the film $23t$, a metal layer having good adhesion to a resin such as nickel or aluminum is formed on the film $23t$ as an adhesion layer, and a metal layer of copper is further formed thereon, whereby a multilayer metal film in which film peeling hardly occurs can be formed. In addition, even when a metal whose surface is easily rusted, such as copper, is used for some of the metal layer $23mi_1$ to $23mi_3$ of the inner first metal film $23mi$ or some of the metal layer $23mo_1$ to $23mo_3$ of the outer first metal film $23mo$, surface protection can be performed by using a metal which is not easily rusted for the metal layer exposed on the surface. For example, in a case where a metal layer of copper is formed, the surface thereof is easily oxidized, and thus, copper can be protected from rust by forming a metal layer of aluminum, nickel, or tin on the surface. In this way, the combined resistance of the electrical resistance of the metal layer made of copper and the electrical resistance of the metal layer made of aluminum, tin, or the like formed on copper is lower than that of the metal layer made of single copper while protecting copper, and thus, improvement of the performance of the piezoelectric coaxial sensor 1 can be expected.

The number of metal layers is not limited to three as long as it is two or more.

Although not particularly illustrated, the inner second metal film $24mi$ and the outer second metal film $24mo$ of the second metal coated film 24 may include a multilayer metal film in the same manner as the example in which the inner first metal film $23mi$ and the outer first metal film $23mo$ described with reference to FIG. 5 are multilayer metal films. In this case, the electric resistance can be reduced as compared with the case where each of the inner second metal film $24mi$ and the outer second metal film $24mo$ is formed of a single-layer metal film. Therefore, the performance of the piezoelectric coaxial sensor 1 can be improved.

In addition, even when there is a problem that a pinhole is formed in one of the metal layers of the inner second metal film $24mi$ and one of the metal layers of the outer second metal film $24mo$, or a problem that the layer thicknesses of one of the metal layers of the inner second metal film $24mi$ and one of the metal layers of the outer second metal film $24mo$ are formed to be thinner than a design value, these problems can be corrected by overlapping the defective metal layer with another layer. In addition, since the pinholes are covered with another metal layer, it is possible to prevent noise due to an external electromagnetic wave or the like from being superimposed.

In addition, since the outer second metal film 24*mo* and the inner second metal film 24*mi* overlap each other, variations in film resistance in the circumferential direction can be suppressed, and improvement in performance of the piezoelectric coaxial sensor 1 can be expected. In addition, the combined resistance of the electric resistance of the inner second metal film 24*mi* and the electric resistance of the outer second metal film 24*mo* of the second metal coated film 24 can be lower than each of the electric resistance of the inner second metal film 24*mi* and the electric resistance of the outer second metal film 24*mo*. Therefore, improvement in piezoelectric coaxial sensor performance can be expected.

Also in this case, the number of metal layers is not limited to three as long as it is two or more.

Hereinafter, the contents of the present invention will be described more specifically with reference to Example and Comparative Example, but the present invention is not limited thereto.

EXAMPLE

A 100 cm long piezoelectric coaxial sensor having substantially the same configuration as that of the piezoelectric coaxial sensor 1 illustrated in FIGS. 1 and 2 was prepared. As the center conductor 11, a stranded wire including seven conductive wires having an element wire outer diameter of about 0.05 mm and having an outer diameter of about 0.15 mm was used. Unlike FIGS. 1 and 2, the polymer piezoelectric layer 12 has a configuration in which a tape-shaped film made of PVDF is spirally wound on the outer peripheral surface of the center conductor 11. In this case, the film was wound so that a part of the film overlapped in a double manner. The outer diameter of the polymer piezoelectric layer 12 was 0.3 mm. The first outer conductor 13 has a configuration in which a plurality of conductive wires having an element wire outer diameter of 0.03 mm are spirally wound on the outer peripheral surface of the polymer piezoelectric layer 12. The outer diameter of the first outer conductor 13 was 0.36 mm. The first jacket layer 14 includes the inner first jacket layer 14*a* and the outer first jacket layer 14*b* as in the above embodiments. The inner first jacket layer 14*a* has a configuration in which the film 14*at* made of polyethylene terephthalate (PET) is spirally wound on the outer peripheral surface of the first outer conductor 13. In this case, the film 14*at* was wound so that a part of the film 14*at* overlapped in a double manner. The outer diameter of the inner first jacket layer 14*a* was 0.38 mm. The outer first jacket layer 14*b* has a configuration in which the adhesive layer 14*ba* is provided on one surface, and the film 14*bt* made of PET is spirally wound on the outer peripheral surface of the inner first jacket layer 14*a*. In this case, the film 14*bt* was wound so that a part of the film 14*bt* overlapped in a double manner. The outer diameter of the outer first jacket layer 14*b* was 0.39 mm. The second outer conductor 15 has a configuration in which a plurality of conductive wires having an element wire outer diameter of 0.03 mm are spirally wound on the outer peripheral surface of the first jacket layer 14. The outer diameter of the second outer conductor 15 was 0.45 mm. The second jacket layer 16 includes the inner second jacket layer 16*a* and the outer second jacket layer 16*b* as in the above embodiments. The inner second jacket layer 16*a* is configured such that the film 16*at* made of PET is spirally wound on the outer peripheral surface of the second outer conductor 15. In this case, the film 16*at* was wound so that a part of the film 16*at* overlapped in a double manner. The outer diameter of the inner second jacket layer 16*a* was 0.47 mm. The outer second jacket layer 16*b* has a configuration in which the adhesive layer 16*ba* is provided on one surface, and the film 16*bt* made of PET is spirally wound on the outer peripheral surface of the inner second jacket layer 16*a*. In this case, the film 16*bt* was wound so that a part of the film 16*bt* overlapped in a double manner. The outer diameter of the outer second jacket layer 16*b* was 0.54 mm.

Comparative Example

A piezoelectric coaxial sensor similar to that of Example was prepared except that the second outer conductor 15 and the second jacket layer 16 were not provided.

Figure 6:
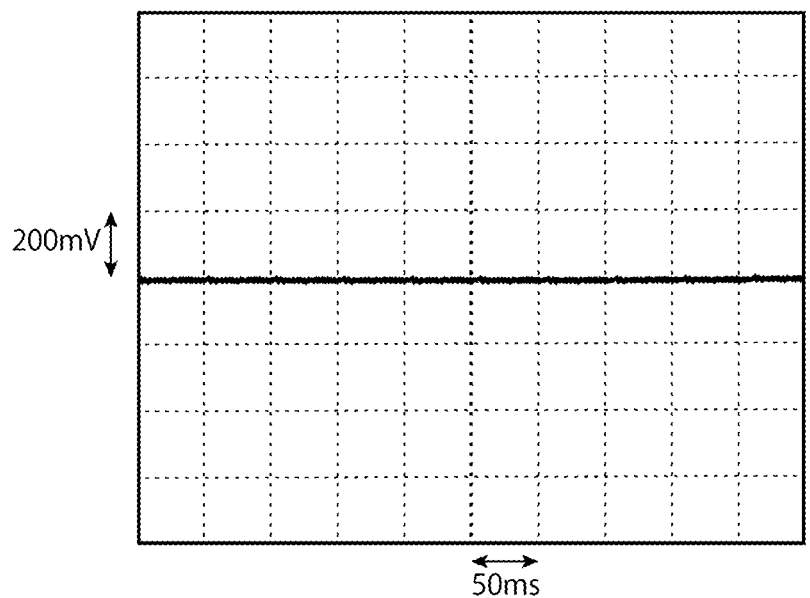
FIG. 6 is a diagram illustrating a waveform of an oscilloscope according to Example.

The prepared piezoelectric coaxial sensor of Example was disposed on a table, and the voltage generated between the center conductor 11 and the first outer conductor 13 of the piezoelectric coaxial sensor was amplified by 20 times and read with an oscilloscope. In this case, the second outer conductor 15 was grounded. The waveform illustrated by the oscilloscope is illustrated in FIG. 6. As illustrated in FIG. 6, no change was observed in the waveform.

Figure 7:
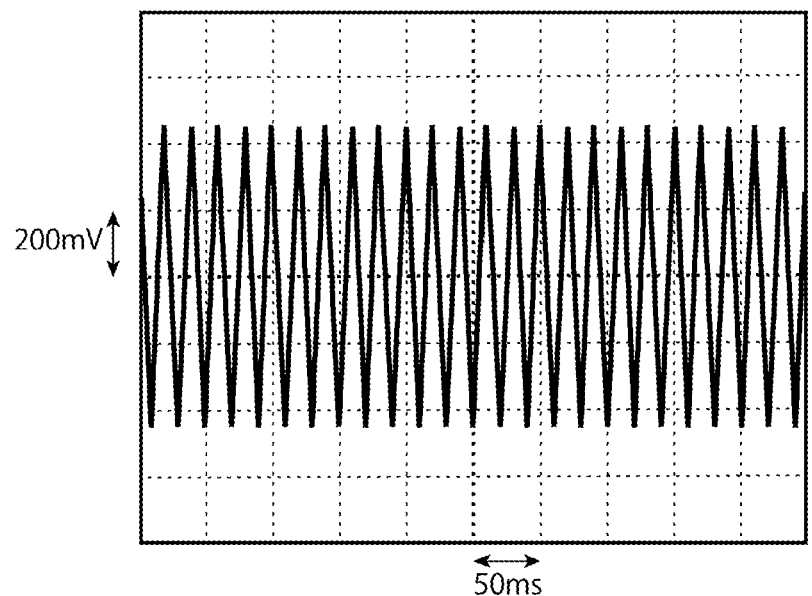
FIG. 7 is a diagram illustrating a waveform of an oscilloscope in Comparative Example.

Next, the prepared piezoelectric coaxial sensor of Comparative Example was arranged on a table in the same manner as in Example, and the voltage generated between the center conductor of the piezoelectric coaxial sensor and the first outer conductor was amplified by 20 times and read with an oscilloscope. The waveform illustrated by the oscilloscope is illustrated in FIG. 7. As illustrated in FIG. 7, the piezoelectric coaxial sensor of Comparative Example output a waveform of approximately 50 Hz. It is considered that this is because the electromagnetic field generated from the power supply was superimposed on the center conductor 11 and the first outer conductor 13 of the piezoelectric coaxial sensor since the frequency is the same as the frequency of the AC power supply in the measurement chamber.

From the above, it has been illustrated that according to the piezoelectric coaxial sensor of the present invention, it is possible to obtain a piezoelectric coaxial sensor having excellent characteristics for suppressing external noise, a high S/N ratio, and improved noise resistance characteristics.

Figure 8:
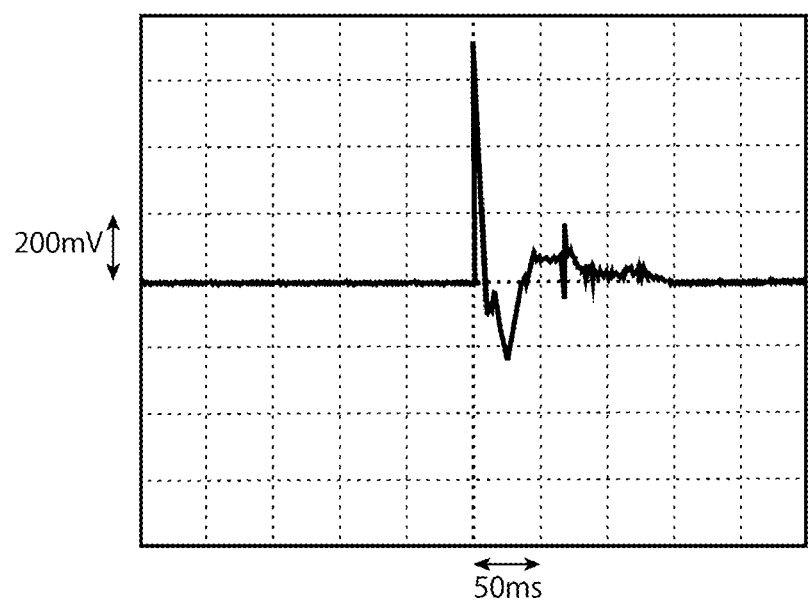
FIG. 8 is a diagram illustrating a waveform of an oscilloscope when the piezoelectric coaxial sensor according to Example is hit.

Next, the piezoelectric coaxial sensor of Example was beaten and impacted. In this case, a waveform indicated by the oscilloscope is illustrated in FIG. 8. As illustrated in FIG. 8, the piezoelectric coaxial sensor of Example detected an impact of the table. Therefore, it is illustrated that the impact can be detected even with the piezoelectric coaxial sensor including the second outer conductor 15.

As described above, according to the present invention, a piezoelectric coaxial sensor having excellent noise resistance characteristics is provided, and is expected to be used in the field of device measurement and the like.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:
1. A piezoelectric coaxial sensor comprising:
a center conductor comprising a conductive wire;

a polymer piezoelectric layer covering an outer peripheral surface of the center conductor;

a first outer conductor surrounding an outer peripheral surface of the polymer piezoelectric layer;

a first jacket layer covering an outer peripheral surface of the first outer conductor; and a second outer conductor surrounding an outer peripheral surface of the first jacket layer, wherein a voltage is generated between the center conductor and the first outer conductor based on induced charges generated in the polymer piezoelectric layer, the second outer conductor is a plurality of conductive wires that surrounds the outer peripheral surface of the first jacket layer, and the piezoelectric coaxial sensor further comprises a metal foil layer wound inside or outside the second outer conductor such that the metal foil layer surrounds the outer peripheral surface of the first jacket layer.

2. The piezoelectric coaxial sensor according to claim 1, further comprising a second jacket layer covering an outer peripheral surface of the second outer conductor.

3. The piezoelectric coaxial sensor according to claim 1, wherein the metal foil layer is in contact with the second outer conductor.

4. A piezoelectric coaxial sensor comprising:

a center conductor comprising a conductive wire;

a polymer piezoelectric layer covering an outer peripheral surface of the center conductor;

a first outer conductor surrounding an outer peripheral surface of the polymer piezoelectric layer;

a first jacket layer covering an outer peripheral surface of the first outer conductor; and a second outer conductor surrounding an outer peripheral surface of the first jacket layer, wherein a voltage is generated between the center conductor and the first outer conductor based on induced charges generated in the polymer piezoelectric layer, the second outer conductor is a plurality of conductive wires that surrounds the outer peripheral surface of the first jacket layer, and the piezoelectric coaxial sensor further comprises a metal coated film that:

is wound inside or outside the second outer conductor such that the metal coated film surrounds an outer peripheral surface of the first jacket layer, and comprises a metal film on at least one surface of a tape-shaped film made of a resin.

5. The piezoelectric coaxial sensor according to claim 4, wherein the metal film is in contact with the second outer conductor.

6. The piezoelectric coaxial sensor according to claim 4, wherein the metal film is a single-layer metal film.

7. The piezoelectric coaxial sensor according to claim 4, wherein the metal film is a multilayer metal film.

8. The piezoelectric coaxial sensor according to claim 4, further comprising a second jacket layer covering an outer peripheral surface of the second outer conductor.

\* \* \* \* \*